United States Patent
Jung et al.

(10) Patent No.: US 10,236,332 B2
(45) Date of Patent: Mar. 19, 2019

(54) ORGANIC LIGHT EMITTING DIODE DISPLAY HAVING HIGH LUMINESCENCE

(71) Applicant: LG Display Co., Ltd., Seoul (KR)

(72) Inventors: Kimoon Jung, Paju (KR); Soonjae Hwang, Paju (KR); Jongsik Shim, Goyang (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/103,232

(22) Filed: Dec. 11, 2013

(65) Prior Publication Data

US 2014/0159019 A1 Jun. 12, 2014

(30) Foreign Application Priority Data

Dec. 12, 2012 (KR) ........................ 10-2012-0144813

(51) Int. Cl.
  *H01L 29/04* (2006.01)
  *H01L 29/10* (2006.01)
  *H01L 31/00* (2006.01)
  *H01L 27/32* (2006.01)

(52) U.S. Cl.
  CPC ............................. *H01L 27/3265* (2013.01)

(58) Field of Classification Search
  CPC ... H01L 51/0545; H01L 27/15; H01L 21/852; H01L 27/1214; H01L 27/12; B82Y 10/00
  USPC ...... 257/40, 50, 23, 30, 149, 49, 59; 438/23, 438/30, 149, 40, 59; 313/504, 506, 540
  See application file for complete search history.

(56) References Cited

U.S. PATENT DOCUMENTS

| | | | |
|---|---|---|---|
| 6,445,005 B1 * | 9/2002 | Yamazaki | H01L 27/322 257/59 |
| 6,512,504 B1 * | 1/2003 | Yamauchi | H01L 27/1251 345/87 |

(Continued)

FOREIGN PATENT DOCUMENTS

| | | |
|---|---|---|
| KR | 1020040092012 A | 11/2004 |
| KR | 1020080051895 A | 6/2008 |

(Continued)

OTHER PUBLICATIONS

United Kingdom Office Action, GB Application No. GB1321082.8, dated Jun. 13, 2014, 6 pages.

(Continued)

*Primary Examiner* — Lex Malsawma
*Assistant Examiner* — Eric W Jones
(74) *Attorney, Agent, or Firm* — Fenwick & West LLP

(57) ABSTRACT

The present disclosure relates to an organic light emitting diode display having high luminescence. The present disclosure suggests an organic light emitting diode display comprising: a data line, a scan line and a driving current line defining a pixel area on a substrate; an anode electrode formed within the pixel area; an additional capacitance formed by overlapping expanded portions of the anode electrode with some portions of the driving current line; a bank defining a light emitting area in the anode electrode; an organic emission layer formed on the anode electrode; and a cathode electrode formed on the organic emission layer. The present disclosure suggests high luminescence organic light emitting diode display by including an additional capacitance for increasing the anode capacitance.

15 Claims, 8 Drawing Sheets

(56) References Cited

U.S. PATENT DOCUMENTS

| | | | | |
|---|---|---|---|---|
| 6,597,121 | B2* | 7/2003 | Imura | H01L 27/3272 313/500 |
| 6,864,638 | B2* | 3/2005 | Ishihara | H01L 27/3276 257/59 |
| 8,466,482 | B2* | 6/2013 | Yamazaki | G02F 1/133305 257/57 |
| 9,092,080 | B2* | 7/2015 | Hyeon | G06F 3/038 |
| 2001/0040645 | A1* | 11/2001 | Yamazaki | G02F 1/133305 349/42 |
| 2004/0263065 | A1* | 12/2004 | Yeh et al. | 313/504 |
| 2005/0127828 | A1* | 6/2005 | Chung | H01L 51/5203 313/504 |
| 2005/0168142 | A1* | 8/2005 | Murakami | G09G 3/3208 313/506 |
| 2005/0253506 | A1* | 11/2005 | Tsai et al. | 313/506 |
| 2006/0001366 | A1* | 1/2006 | Chung | H01L 27/3276 313/506 |
| 2006/0082295 | A1* | 4/2006 | Chin et al. | 313/506 |
| 2006/0118788 | A1* | 6/2006 | Park | H01L 27/124 257/72 |
| 2006/0119556 | A1* | 6/2006 | Winters | G09G 3/3225 345/82 |
| 2006/0125381 | A1 | 6/2006 | Oh | |
| 2006/0158095 | A1 | 7/2006 | Imamura | |
| 2007/0085475 | A1* | 4/2007 | Kuwabara | H01L 27/3246 313/506 |
| 2008/0024402 | A1* | 1/2008 | Nishikawa | H01L 51/5209 345/82 |
| 2008/0111475 | A1* | 5/2008 | Baek | H01L 27/3272 313/504 |
| 2008/0118743 | A1* | 5/2008 | Lee et al. | 428/332 |
| 2008/0238311 | A1* | 10/2008 | Sung et al. | 313/512 |
| 2008/0252201 | A1* | 10/2008 | Pearce et al. | 313/504 |
| 2009/0102773 | A1 | 4/2009 | Um et al. | |
| 2010/0019656 | A1 | 1/2010 | Yu et al. | |
| 2010/0271354 | A1* | 10/2010 | Yamashita et al. | 345/206 |
| 2011/0012816 | A1 | 1/2011 | Kang et al. | |
| 2011/0165714 | A1* | 7/2011 | Oh | H01L 27/3246 438/34 |
| 2011/0193478 | A1 | 8/2011 | Kim | |
| 2014/0184975 | A1 | 7/2014 | Um et al. | |

FOREIGN PATENT DOCUMENTS

| | | |
|---|---|---|
| KR | 1020090040652 A | 4/2009 |
| KR | 1020110056994 A | 5/2011 |
| KR | 10-2012-0042433 A | 5/2012 |

OTHER PUBLICATIONS

German Office Action, German Application No. 10 2013 113 082.8, dated Jun. 24, 2016, 18 pages.

* cited by examiner

ORGANIC LIGHT EMITTING DIODE DISPLAY HAVING HIGH LUMINESCENCE

CROSS-REFERENCE TO RELATED APPLICATIONS

This application claims the benefit of Korea Patent Application No. 10-2012-0144813 filed on Dec. 12, 2012, which is incorporated herein by reference for all purposes as if fully set forth herein.

BACKGROUND

Field of the Invention

The present disclosure relates to an organic light emitting diode display having high luminescence. Especially, the present disclosure relates to an organic light emitting diode display having high luminescence with low power consumption by enhancing the capacity of anode electrode and the capacitance of organic light emitting diode itself.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

The electroluminescence display device is categorized in the inorganic light emitting diode display device and the organic light emitting diode display device according to the luminescence material. As a self-emitting display device, the electroluminescence display device has a response speed that is very fast, brightness that is very high and a large viewing angle.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates the lights due to the energy from the excition formed at the excitation state in which the hole and the electron are recombined at the emission layer EML.

The organic light emitting diode radiates light due to the energy from the excition formed at the excitation state in which the hole from the anode and the electron from the cathode are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLED) using the organic light emitting diode can be categorized in the passive matrix type organic light emitting diode display (or PMOLED) and the active matrix type organic light emitting diode display (or AMOLED).

The active matrix type organic light emitting diode display (or AMOLED) shows video data by controlling the current applied to the organic light emitting diode using the thin film transistor (or TFT).

FIG. 2 is the exemplary circuit diagram illustrating the structure of one pixel in the active matrix organic light emitting diode display (or AMOLED). FIG. 3 is a plane view illustrating the structure of one pixel in the AMOLED. FIG. 4 is a cross sectional view along the cutting line I-I' for illustrating the structure of the AMOLED.

Referring to FIGS. 2 and 3, the active matrix organic light emitting diode display of the bottom emission type comprises a switching thin film transistor ST, a driving thin film transistor DT connected to the switching thin film transistor ST, and an organic light emitting diode OLED connected to the driving thin film transistor DT. By a scan line SL, a data line DL and a driving current line VDD disposed on a substrate SUB, a pixel area is defined. The organic light emitting diode OLED is formed in one pixel area so that it defines a light emitting area within the pixel area.

The switching thin film transistor ST is formed where the scan line SL and the data line DL cross. The switching thin film transistor ST selects the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT drives an anode electrode ANO of the organic light emitting diode OLED disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED.

Referring to FIG. 4 more detail, on the substrate SUB of the bottom emission type active matrix organic light emitting diode display, the gate electrodes SG and DG of the switching thin film transistor ST and the driving thin film transistor DT, respectively are formed. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI.

The passivation layer PAS is deposited over the substrate SUB having the switching thin film transistor ST and the driving thin film transistor DT. A color filter CF may be formed at the anode electrode ANO area which is formed later. It is proper to form the color filter CF as it may have larger area as possible. For example, in the pixel area surrounded by the data line DL, the driving current line VDD and the former scan line SL, it is proper that the color filter CF may have the maximized area.

The upper surface of the substrate having the color filter CF is not even and/or smooth, but may be uneven and/or rugged having many steps. In order for the organic light emitting diode display to have good luminescent quality over the whole display area, the organic emission layer WOLE should be formed on an even or smooth surface. So, to make the upper surface in planar and even conditions, the over coat layer OC is deposited on the whole surface of the substrate SUB.

Then, on the over coat layer OC, the anode electrode ANO of the organic light emitting diode OLED is formed. Here, the anode electrode ANO is connected to the drain electrode DD of the driving thin film transistor DT through the contact hole penetrating the over coat layer OC and the passivation layer PAS.

In the interim, during one picture frame period, the data voltage Vdata should be applied to the anode electrode ANO with sufficient voltage amount for representing correct color value. To do so, a storage capacitance STG having enough capacitance for charging the anode electrode ANO within one picture frame period may be further included in the pixel area. As shown in FIG. 2, the storage capacitance STG can be formed between the drain electrode SD of the switching thin film transistor ST and the drain electrode DD of the driving thin film transistor DT. In detail, as shown in FIGS. 3 and 4, the storage capacitance may be formed by overlapping the gate electrode DG of the driving thin film transistor DT with the anode electrode ANO. In order to ensure the storage capacitance STG having enough capacity, it is required to ensure the overlapping area of the gate electrode DG of the driving thin film transistor DT with the anode electrode ANO as large as possible.

On the substrate SUB having the anode electrode ANO, a bank BANK is formed to distinguish the non-emission area having the switching thin film transistor ST, the driving thin film transistor DT and the various lines DL, SL and VDD from the emitting area having the organic light emitting diode OLED, for defining the light emitting area. The bank BANK can define the overlapping area of the organic emission layer OLE with the anode electrode ANO. Therefore, the light emitting area can be defined by the bank BANK. Generally, the light emitting area is included within the pixel area and has the maximum area as possible.

As explained above, the light emitting area is directly related to the color filter CF. Therefore, it is proper that the area of the color filter CF has a little larger area than the light emitting area defined by the bank BANK. That is, even though the color filter CF is formed as having maximized area, the actual light emitting area can be defined by the bank BANK.

The anode electrode ANO is exposed by the bank BANK. On the anode electrode ANO and the bank BANK, the organic emission layer WOLE is deposited. On the organic emission layer WOLE, the cathode electrode CAT is deposited sequentially. Consequently, the organic light emitting diode OLED connected to the driving thin film transistor DT is completed.

The enlarged diagram shown in the dotted circles of FIG. 3 illustrates the detailed structure of the light emitting area defined by the bank BANK. The anode electrode ANO may be formed as not to overlap with the data line DL, the former scan line SL and the driving current line VDD. As the organic light emitting diode is driven by current driving method, the anode electrode ANO is supplied with a large amount of the electric current via the driving current line VDD. Therefore, when the anode electrode ANO is overlapped with the lines DL, SL and/or VDD surrounding the anode electrode ANO, it is very highly possible that the parasitic capacitance is formed at the passivation layer PAS inserted therebetween.

Therefore, as shown in FIGS. 3 and 4, when forming the anode electrode ANO, it should have a first predetermined distance G1 from the driving current line VDD by considering the alignment margin in the patterning process. Furthermore, when forming the bank BANK on the anode electrode ANO, a second predetermined distance G2 inward the pixel area from the anode electrode ANO by considering the alignment margin in the patterning process. Consequently, as the bank BANK should be formed as covering some area of the anode electrode ANO, the rectangular area illustrated by alternated long and short dash line and hatched with inclined line may be the light emitting area. Further, as the organic emission layer WOLE is deposited on the anode electrode ANO, this light emitting area can define the aperture ratio of the pixel area. The light emitting area may have the loss amount corresponding to summation of the first and the second predetermined distances, G1+G2. Like this, at the data line DL side, the light emitting area may have the loss amount corresponding to summation of the first and the second predetermined distances, G1+G2. Generally, the alignment margin can be set as 1~3 um (micrometer). Therefore, the total loss distance of the light emitting area may be 2~6 um by the alignment margin of the manufacturing process.

Like this, in one pixel area, various elements including the thin film transistors ST and DT and the storage capacitance STG can be formed. In convenience, FIG. 3 illustrates two thin film transistors ST and DT. However, more thin film transistors can be further included to compensate the degraded characteristics of the elements due to various causes between elements. Due to this complexity, the aperture ratio, the ratio of the light emitting area to the pixel area, in the organic light emitting diode display according to the related art may be 30%.

In the organic light emitting diode display as mentioned above, the organic light emitting diode including the anode electrode ANO, the organic emission layer WOLE and the cathode electrode CAT naturally have its own capacitance. This is called 'the anode capacitance'. Referring to FIG. 2 again, the anode capacitance Coled is represented as an equivalent circuit diagram of a capacitance formed between the two electrodes of the organic light emitting diode OLED.

As the anode capacitance Coled is increased, the luminescence (or brightness) of the organic light emitting diode can be increased. That is, in order to have higher or brighter luminescence with the same light emitting area, the anode capacitance Coled should have larger capacitance for better image quality. Therefore, when selecting the organic light emitting material, it is proper to select the organic material having higher permittivity. However, as the permittivity is the natural value of the material, it is very hard and restrictive to select organic light emitting material having enough permittivity we want.

Referring to FIG. 2, when the switching thin film transistor ST turns on as the scan voltage Vscan is supplied to the scan line SL, the data voltage Vdata supplied to the data line DL turns on the driving thin film transistor DT. Then, the electric current and voltage for driving the organic light emitting diode OLED is supplied to the organic light emitting diode OLED. At the same time, the data voltage Vdata is stored at the storage capacitance STG. At this time, the voltage supplied to the anode electrode ANO can be changed (or reduced) by the data voltage Vdata corresponding to the ratio of the storage capacitance Cst and the anode capacitance Coled. This change may cause the reduction of the luminescence (or brightness) of the organic emission layer OLE.

$$\Delta V_{anode} = V_{data}(C_{st}/C_{oled}) \qquad \text{[Equation 1]}$$

Here, Vanode means the anode voltage supplied to the anode electrode ANO, Cst means the capacity amount of the storage capacitance STG, and the Coled means the anode capacitance of the organic light emitting diode OLED.

According to the Equation 1, in order to minimize the change of the anode electrode Vanode, the capacitance value of Coled may be increased or the amount of the storage capacitance Cst may be reduced. As mentioned above, as the anode capacitance Coled is related to the natural value of the organic emission layer OLE, the most possible method is to reduce the capacity amount Cst of storage capacitance STG. However, the storage capacitance STG is for supplying certain voltage to the anode electrode ANO during one picture frame so that it should have enough capacitance for maintaining high capacity value. Therefore, the storage capacitance cannot be reduced freely as wanted.

By these various restrictions, the currently used maximized aperture ratio according to the related art is 30% at most. One possible method for getting the organic light emitting diode display having higher luminescence is to increase the electric current for driving the organic light emitting diode OLED. However, this method has another problem in that power consumption is increased. It is very hard to design and manufacture an organic light emitting diode display with satisfying the various conditions at the same time, such as having lowered parasitic capacitance, ensuring enough storage capacitance, and having higher aperture ratio.

SUMMARY

In order to overcome the above mentioned drawbacks, the purpose of the present disclosure is to suggest an organic light emitting diode display having high aperture ratio in which the ratio of the light emitting area to the pixel area is enhanced. Another purpose of the present disclosure is to suggest an organic light emitting diode display having high luminescence having an additional capacitance for enlarging the anode capacitance formed at the organic light emitting diode. Yet another purpose of the present disclosure is to suggest an organic light emitting diode display having high aperture ratio by ensuring larger light emitting area even though the additional capacitance is included.

In order to accomplish the above purpose, the present disclosure suggests an organic light emitting diode display comprising: a data line, a scan line and a driving current line defining a pixel area on a substrate; an anode electrode formed within the pixel area; an additional capacitance formed by overlapping expanded portions of the anode electrode with some portions of the driving current line; a bank defining a light emitting area in the anode electrode; an organic emission layer formed on the anode electrode; and a cathode electrode formed on the organic light emitting layer.

The organic light emitting diode display further comprises a color filter disposed under the anode electrode within the pixel area; and an over coat layer covering the color filter, and disposed under the anode electrode.

The organic light emitting diode display further comprises a switching thin film transistor connected to the data line and the scan line in the pixel area; and a driving thin film transistor connected to the switching thin film transistor and the driving current line.

The organic light emitting diode is characterized in that one of a drain electrode and a source electrode of the switching thin film transistor is connected to a gate electrode of the driving thin film transistor, and one of a drain electrode and a source electrode of the driving thin film transistor is connected to the anode electrode.

The organic light emitting diode display further comprises a storage capacitance formed between a gate electrode of the driving thin film transistor and the anode electrode.

Furthermore, the present disclosure suggests an organic light emitting diode display comprising: data lines and scan lines defining pixel areas on a substrate; a driving current line commonly allocated at a first pixel column, and a second pixel column which are neighboring each other among the pixel areas; a first anode electrode formed at the first pixel column, and a second anode electrode formed at the second pixel column; a first additional capacitance formed by expanding from the first anode electrode and overlapping to one portion of the driving current line, and a second additional capacitance formed by expanding from the second anode electrode and overlapping to other portion of the driving current line; bank defining light emitting areas at the first and the second anode electrodes, respectively; an organic emission layer on the first and the second anode electrode; and a cathode electrode on the organic emission layer and the electron transport layer.

The organic light emitting diode display further comprises: a color filter disposed under the first and the second anode electrodes within the pixel areas; and an over coat layer covering the color filter, and disposed under the first and the second anode electrodes.

The organic light emitting diode display is characterized in that the first anode electrode and the second electrode are disposed with a predetermined distance on the driving current line.

The organic light emitting diode display further comprises: a switching thin film transistor connected to the data line and the scan line in the each pixel area; and a driving thin film transistor connected to the switching thin film transistor and the driving current line.

The organic light emitting diode display is characterized in that one of a drain electrode and a source electrode of the switching thin film transistor is connected to a gate electrode of the driving thin film transistor, and one of a drain electrode and a source electrode of the driving thin film transistor is connected to at least one of the first and the second anode electrodes.

The organic light emitting diode display further comprises: a storage capacitance formed between a gate electrode of the driving thin film transistor and at least one of the first and the second anode electrodes.

The organic light emitting diode display according to the present disclosure includes an additional capacitance connected to the anode capacitance of the organic light emitting diode in parallel. Especially, the additional capacitance has the structure in which the light emitting area of the organic light emitting diode display can be enlarged. Therefore, the present disclosure suggests an organic light emitting diode display having an enlarged light emitting area, ensuring enhanced the anode capacitance and representing brighter luminescence with the same power consumption. Further, the organic light emitting diode display according to the present disclosure includes the additional capacitance for enhancing the anode capacitance without enlarging the storage capacitance which may cause the lowered aperture ratio so that it can represent high luminescence without enlarging the pixel area and/or aperture ratio.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
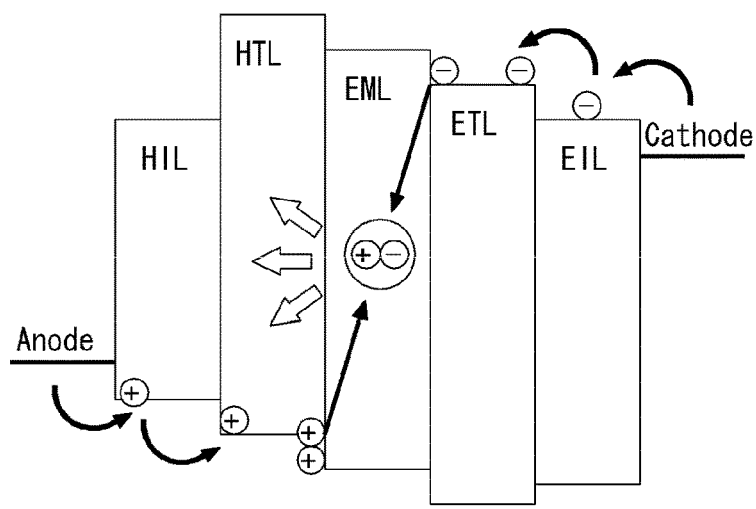
FIG. 1 is a diagram illustrating the structure of the organic light emitting diode according to the related art.
Figure 2:
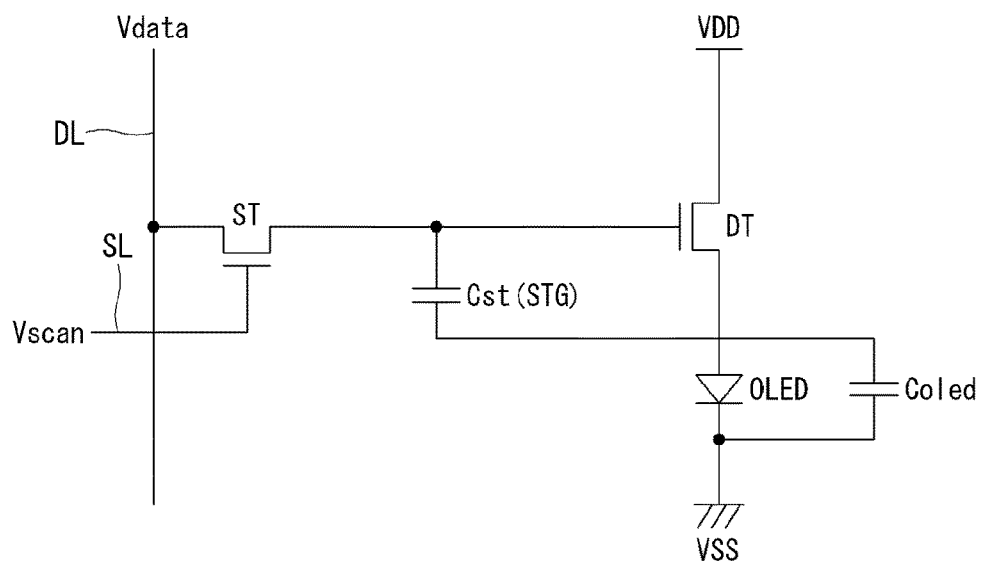
FIG. 2 is the exemplary circuit diagram illustrating the structure of one pixel in the active matrix organic light emitting diode display (or AMOLED) according to the related art.
Figure 3:
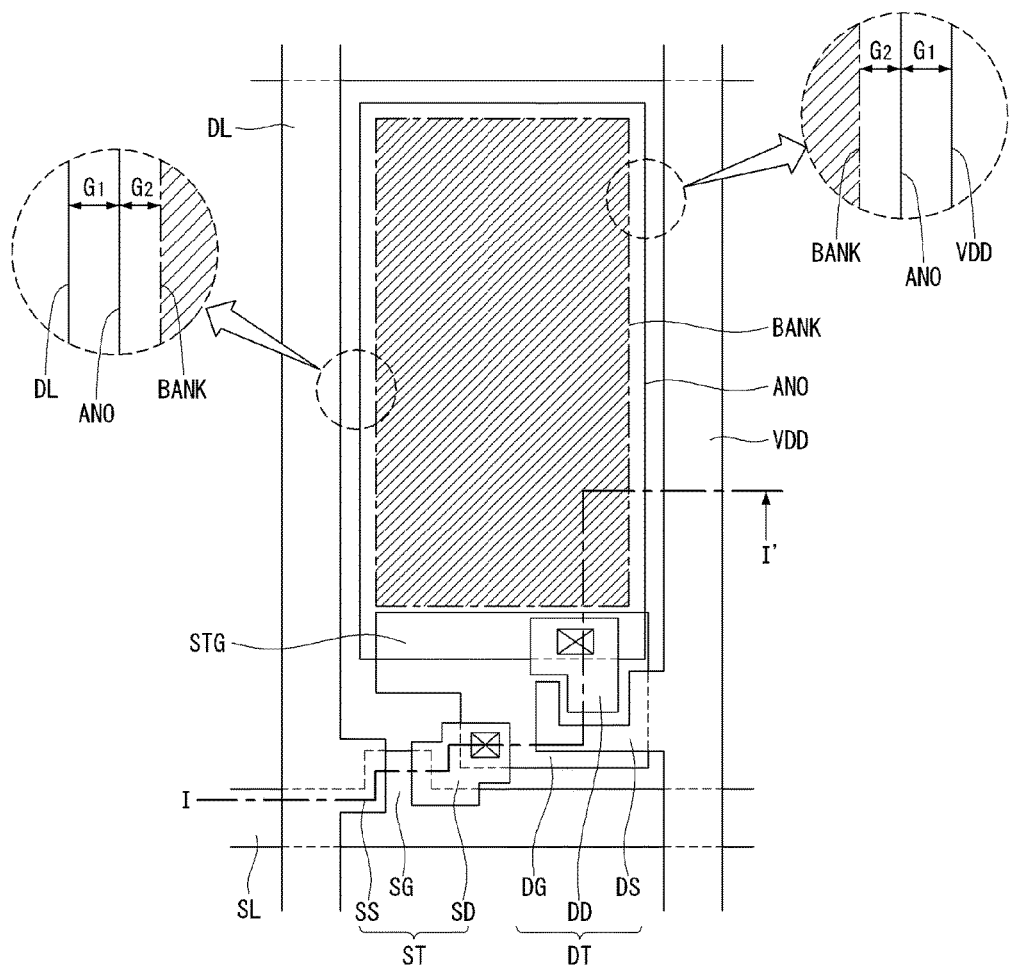
FIG. 3 is a plane view illustrating the structure of one pixel in the AMOLED of the bottom emission type according to the related art.
Figure 4:
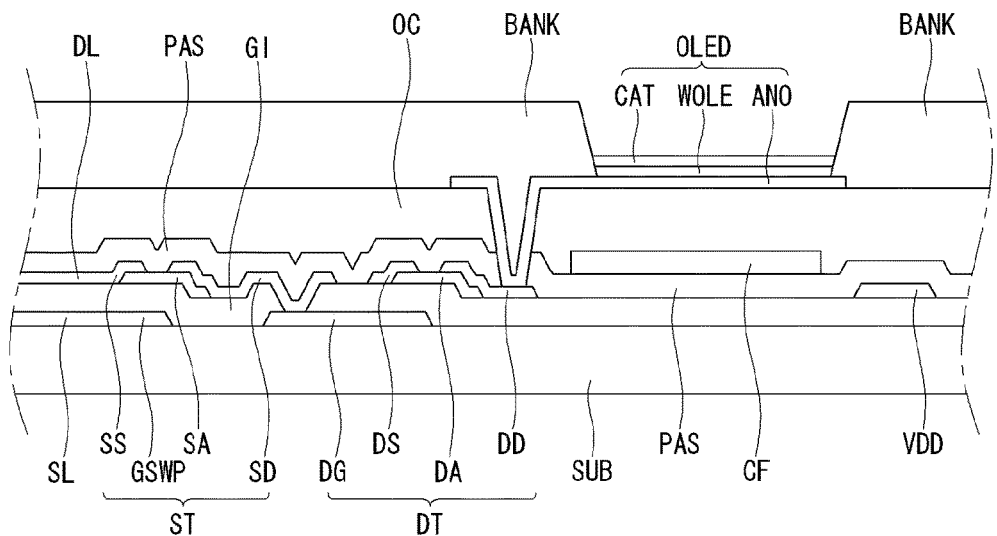
FIG. 4 is a cross sectional view along the cutting line I-I' for illustrating the structure of the bottom emission type AMOLED according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

The main feature of the present disclosure is to ensure the largest anode capacitance as possible. According to the Equation 1 mentioned above, as it is hard to reduce the amount of the storage capacitance Cst, the amount of the anode capacitance Coled should be enlarged. Referring to following Equation 2 representing the amount of the capacitance, we will explain how to enlarge the anode capacitance Coled.

$$C = \varepsilon(A/d) \qquad \text{Equation 2}$$

Here, C means the amount of the capacitance, ε means the permittivity of the dielectric material (or organic material), A is the area of the electrodes, and d means the distance between the electrodes that is, the thickness of the dielectric material. In order to ensure the large amount of the capacitance, it is possible to select a dielectric material having higher permittivity, to enlarge the surface area of the electrodes facing each other, or to select an optimized thickness of the dielectric material.

As mentioned above, to select a dielectric material having higher permittivity is very hard because it means the material of the organic light emitting material is changed. Further, to select an optimized thickness of the dielectric material is complicated problem, because it may affect to the characteristics of the organic light emitting diode directly. Finally, we can choose the method of enlarging the surface area of the electrodes facing each other. Merely to enlarge the area of the electrodes have not meaning. The capacitance should be enlarged. In other words, the surface area of the organic emission layer WOLE should be enlarged as well as the surface area of the anode electrode. However, as the surface area of the organic emission layer WOLE is restricted within the pixel area, it is not easy to enlarge the amount of the capacitance.

Figure 5:
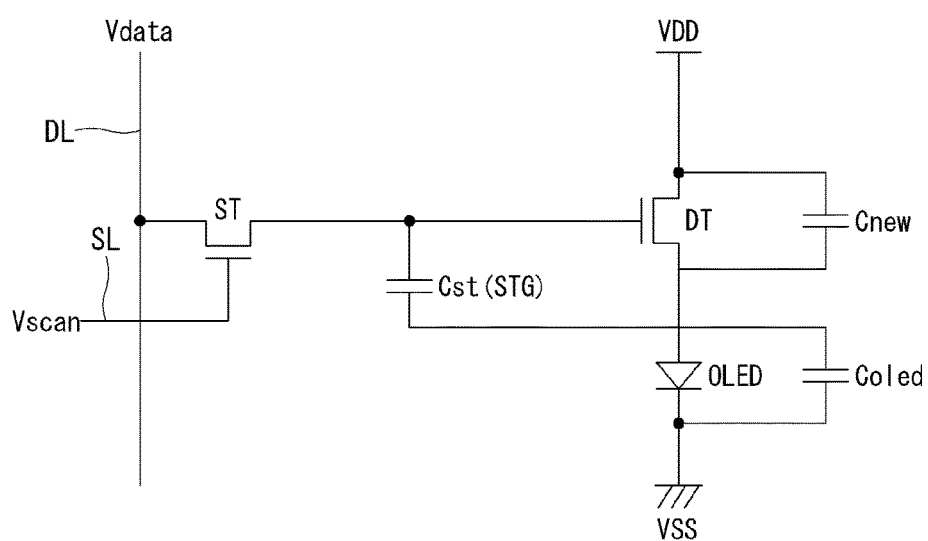
FIG. 5 is an equivalent circuit diagram illustrating the structure of one pixel in the organic light emitting diode display according to the present disclosure.

Therefore, it is required to change of the structure in that an additional capacitance is further included without any affection on the aperture ratio. In the present disclosure, as shown in FIG. 5, an additional capacitance Cnew connected to the organic light emitting diode OLED in parallel is further included. For example, between the source electrode DS of the driving thin film transistor DT and the drain electrode DD of the driving thin film transistor DT, the additional capacitance Cnew is located. FIG. 5 is an equivalent circuit diagram illustrating the structure of one pixel in the organic light emitting diode display according to the present disclosure.

Figure 6:
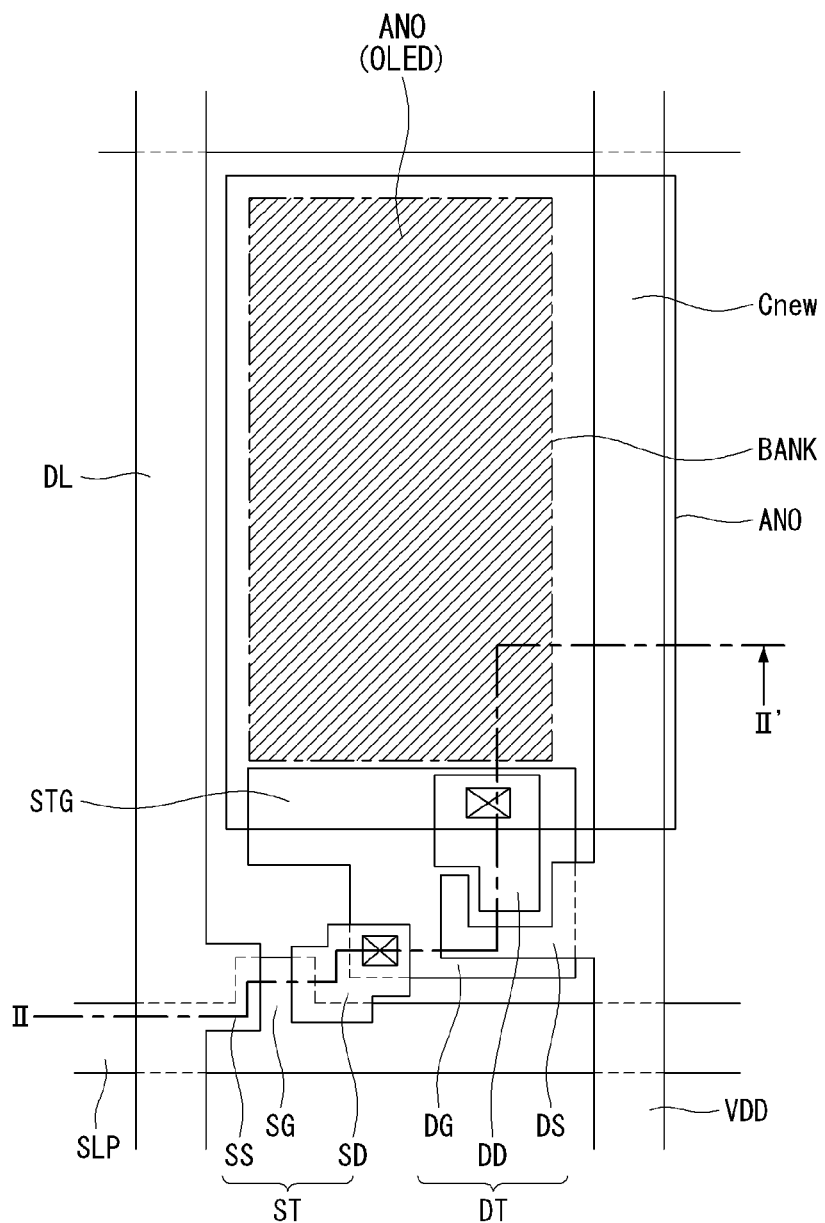
FIG. 6 is a plane view illustrating a bottom emission type organic light emitting diode display according to the first embodiment of the present disclosure.
Figure 7:
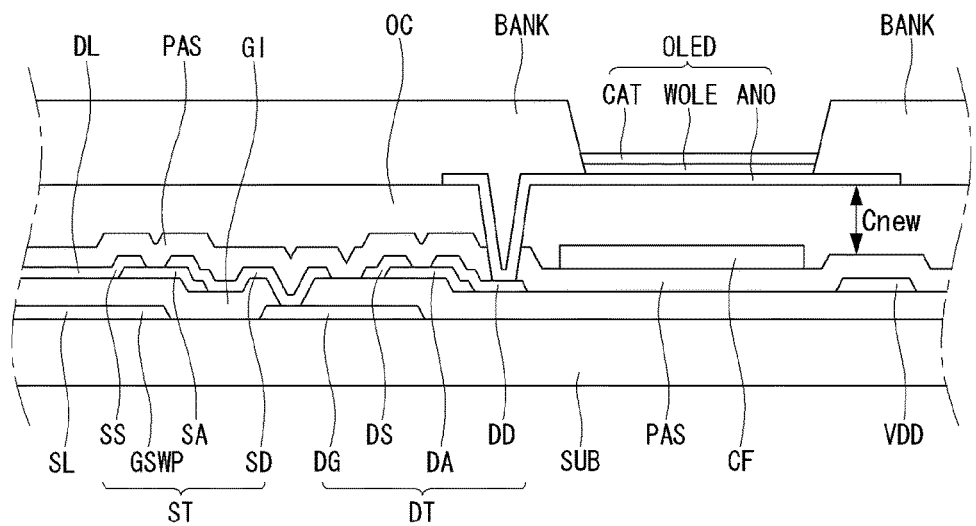
FIG. 7 is a cross sectional view along the cutting line of II-II' in FIG. 6 for illustrating the structure of a bottom emission type organic light emitting diode display according to the present disclosure.

In order not to affect to the aperture ratio with satisfying the equivalent circuit diagram shown in FIG. 5, the additional capacitance Cnew according to the present disclosure may be formed by overlapping the anode electrode ANO with the driving current line VDD connected to the source electrode DS of the driving thin film transistor DT. Hereinafter, referring to FIGS. 6 and 7, we will explain about an organic light emitting diode display according to the present disclosure. FIG. 6 is a plane view illustrating a bottom emission type organic light emitting diode display according to the first embodiment of the present disclosure. FIG. 7 is a cross sectional view along the cutting line of II-II' in FIG. 6 for illustrating the structure of a bottom emission type organic light emitting diode display according to the present disclosure.

The bottom emission type active matrix organic light emitting diode display according to the first embodiment of the present disclosure includes a switching thin film transistor ST, a driving thin film transistor DT connected to the switching thin film transistor ST, and an organic light emitting diode OLED connected to the driving thin film transistor DT.

The switching thin film transistor ST is formed where the scan line SL and the data line DL is crossing. The switching thin film transistor ST acts for selecting the pixel which is connected to the switching thin film transistor ST. The switching thin film transistor ST includes a gate electrode SG branching from the gate line GL, a semiconductor channel layer SA overlapping with the gate electrode SG, a source electrode SS and a drain electrode SD. The driving thin film transistor DT acts for driving an anode electrode ANO of the organic light emitting diode OLED disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED. Between the anode electrode ANO and the cathode electrode CAT, the organic emission layer OLE is disposed. The cathode electrode CAT is connected to the base voltage VSS.

Especially, the organic light emitting diode OLED according to the first embodiment of the present disclosure has the structure in which the anode electrode ANO is overlapped with some portions of the driving current line VDD. One side of the rectangular shaped anode electrode ANO closed to the driving current line VDD may be extended/expanded to overlap with some portions of the driving current line VDD. As a result, the additional capacitance Cnew may be formed between the expanded portions of the anode electrode ANO and the some portions of the driving current line VDD.

Referring to FIG. 7 again, we will explain about the cross section structure of the organic light emitting diode display according to the first embodiment of the present disclosure. On the transparent substrate SUB, gate electrodes SG and DG of the switching thin film transistor ST and the driving thin film transistor DT. On the gate electrodes SG and DG, a gate insulator GI is deposited. On the gate insulator GI overlapping with the gate electrodes SG and DG, semiconductor layers SA and DA are formed, respectively. On the semiconductor layers SA and DA, source electrodes SS and DS and drain electrodes SD and DD are formed by facing each other and separated with a predetermined distance, respectively. The drain electrode SD of the switching thin film transistor ST is connected to the gate electrode DG of the driving thin film transistor DT via a contact hole formed at the gate insulator GI.

During one picture frame period, the data voltage Vdata should be fully and completely supplied to the anode electrode ANO. To do so, a storage capacitance STG is formed to help charging the anode electrode ANO quickly. As shown in FIG. 5, the storage capacitance is formed at the space between the drain electrode SD of the switching thin film transistor ST and the drain electrode DD of the driving thin film transistor DT. In detail, as shown in FIGS. 6 and 7, the storage capacitance is formed by overlapping the anode electrode ANO with the gate electrode DG of the driving thin film transistor DT. That is, the storage capacitance STG may be formed by forming expanded portions of the gate electrode DG of the driving thin film transistor DT as having the width close to the width of the pixel area, and overlapping these expanded portions with some portions of the anode electrode ANO.

A passivation layer PAS is deposited as covering the substrate having the switching thin film transistor ST and the driving thin film transistor DT. A color filter CF may be formed at the area corresponding to the anode electrode ANO which may be formed later. The color filter CF would have a larger area as possible. For example, in the pixel area surrounded by the data line DL, the driving current line VDD and the former scan line SL, it is proper that the color filter CF may have the maximized area.

The upper surface of the substrate having the color filter CF is not even and/or smooth, but is uneven and/or rugged having many steps. In order for the organic light emitting diode display to have good luminescent quality over the whole display area, the organic emission layer OLE should be formed on an even or smooth surface. So, to make the upper surface in planar and even conditions, the over coat layer OC is deposited on the whole surface of the substrate OC.

Then, on the over coat layer OC, an anode electrode ANO of the organic light emitting diode OLED is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BANK is formed to distinguish the non-emission area having the switching thin film transistor ST, the driving thin film transistor DT and the various lines DL, SL and VDD from the emitting area having the organic light emitting diode OLED, so as for defining the light emitting area. The bank BANK can define the overlapping area of the organic emission layer OLE with the anode electrode ANO. Therefore, the light emitting area can be defined by the bank BANK. Generally, the light emitting area is included within the pixel area and has the maximum area as possible.

As explained above, the light emitting area is directly related to the color filter CF. Therefore, it is proper that the area of the color filter CF has a little larger area than the light emitting area defined by the bank BANK. That is, even though the color filter CF is formed as having maximized area, the actual light emitting area can be defined by the bank BANK.

The anode electrode ANO is exposed by the bank BANK. On the anode electrode ANO and the bank BANK, the organic emission layer WOLE is deposited. On the organic emission layer OLE, the cathode electrode CAT is deposited sequentially. Consequently, the organic light emitting diode OLED connected to the driving thin film transistor DT is completed.

In the organic light emitting diode display according to the first embodiment of the present disclosure, the anode electrode ANO further forms the additional capacitance Cnew by overlapping with some portions of the driving current line VDD. In other words, even though the anode electrode ANO has area larger than opened area by the bank BANK, the organic emission layer OLE and the color filter CF may has the area corresponding to the opened are by the bank BANK. Therefore, the aperture ratio, the area ratio of the light emitting area to the pixel area, is not changed so much from that of the related art. However, thanks to the additional capacitance Cnew newly formed by overlapping some portions of the anode electrode ANO and some portions of the driving current line VDD, we can get an effect as the anode capacitance is enlarged.

Here, the additional capacitance is formed at the space filled with the over coat layer OC inserted between the anode electrode ANO and the driving current line VDD. As the over coat layer OC is an organic material (or dielectric material), its permittivity is less than that of the inorganic material. When a high permittivity material is inserted between the anode electrode ANO and the driving current line VDD, as shown in Equation 2, the capacitance may have larger value than expected and/or designed value. Too much enlarged capacitance, for example over the compensating amount, may badly affect to the display quality. However, in the present disclosure, we use the over coat layer OC having low permittivity and thick thickness, so that the additional capacitance can have optimized amount enough to the purpose for compensating the anode capacitance Coled.

Furthermore, when the color filter CF is formed to have thick thickness, as the thickness of the over coat layer OC is too thick, the additional capacitance may not be enough for compensating the anode capacitance Coled. In this case, not shown in figures, an additional electrode overlapping with some portions of the driving current line VDD under the gate insulator GI may be further formed and connected to the anode electrode ANO.

For yet another example, by varying the shape of the anode electrode ANO, the overlapping area with the driving current line VDD can be controlled so as to the amount of the additional capacitance Cnew can be controlled. That is, it is possible to control the amount of the additional capacitance Cnew using various methods.

In the first embodiment of the present disclosure, one of main features is to form the additional capacitance Cnew connected to the anode electrode ANO in parallel. As a result, it is possible to reduce the change of the anode voltage. This leads to the compensation of the driving thin film transistor and/or enhancement of the brightness (luminescence) of the organic light emitting diode, for enhancing the display quality.

Figure 8:
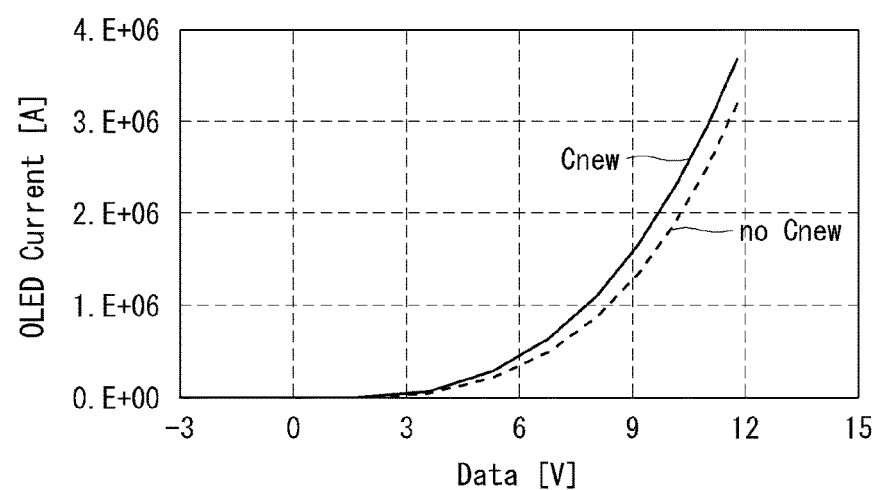
FIG. 8 is a graph illustrating the enhanced characteristics of the organic light emitting diode when the additional capacitance according to the present disclosure is included.

FIG. 8 is a graph illustrating the enhanced characteristics of the organic light emitting diode when the additional capacitance according to the present disclosure is included. Referring to FIGS. 5 and 8, it is clear that, by forming the additional capacitance Cnew between the driving current line VDD and the anode electrode ANO, the voltage variations on the anode electrode ANO can be reduced, the luminescence of the organic light emitting diode OLED can be enhanced, and the compensation ability can be enhanced. According to the FIG. 8, the enlarged current amount is about 14~15%. Therefore, it is possible to get brighter display with the same power consumption, and the compensation ability and uniformity of the gray scale can be enhanced.

In addition, the additional capacitance Cnew can be formed by merely overlapping the anode electrode ANO with the driving current line VDD, so there is no change in the manufacturing process. Just by changing the mask pattern for defining the shape of the anode electrode ANO, the main feature of the present disclosure can be accomplished. That is, any additional manufacturing process and/or any additional cost is not required.

Figure 9:
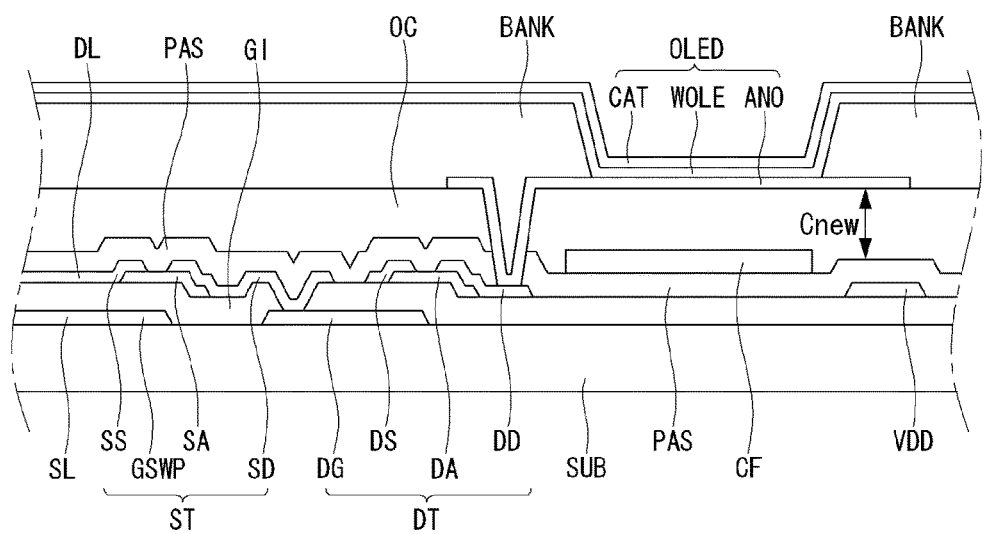
FIG. 9 is a cross sectional view illustrating the structure of an organic light emitting diode display according to another example of the first embodiment of the present disclosure in which the organic emission layer and the cathode layer are deposited all over the substrate.

In the explanation of the first embodiment of the present disclosure, the organic emission layer OLE and the cathode electrode CAT are formed individually/separately per each pixel area. However, each pixel area has its own color filter CF, so that, in order to simplify the manufacturing process, the organic emission layer OLE and the cathode electrode CAT are deposited in one layer body, respectively. For example, as shown in FIG. 9, the organic emission layer WOLE and the cathode electrode CAT may not be patterned at each pixel area. Instead, the organic emission layer WOLE can be deposited covering the whole surface of the substrate and the cathode electrode CAT can be also deposited covering the whole surface of the organic emission layer OLE. FIG. 9 is a cross sectional view illustrating the structure of an organic light emitting diode display according to another example of the first embodiment of the present disclosure in which the organic emission layer and the cathode layer are deposited all over the substrate.

Figure 10:
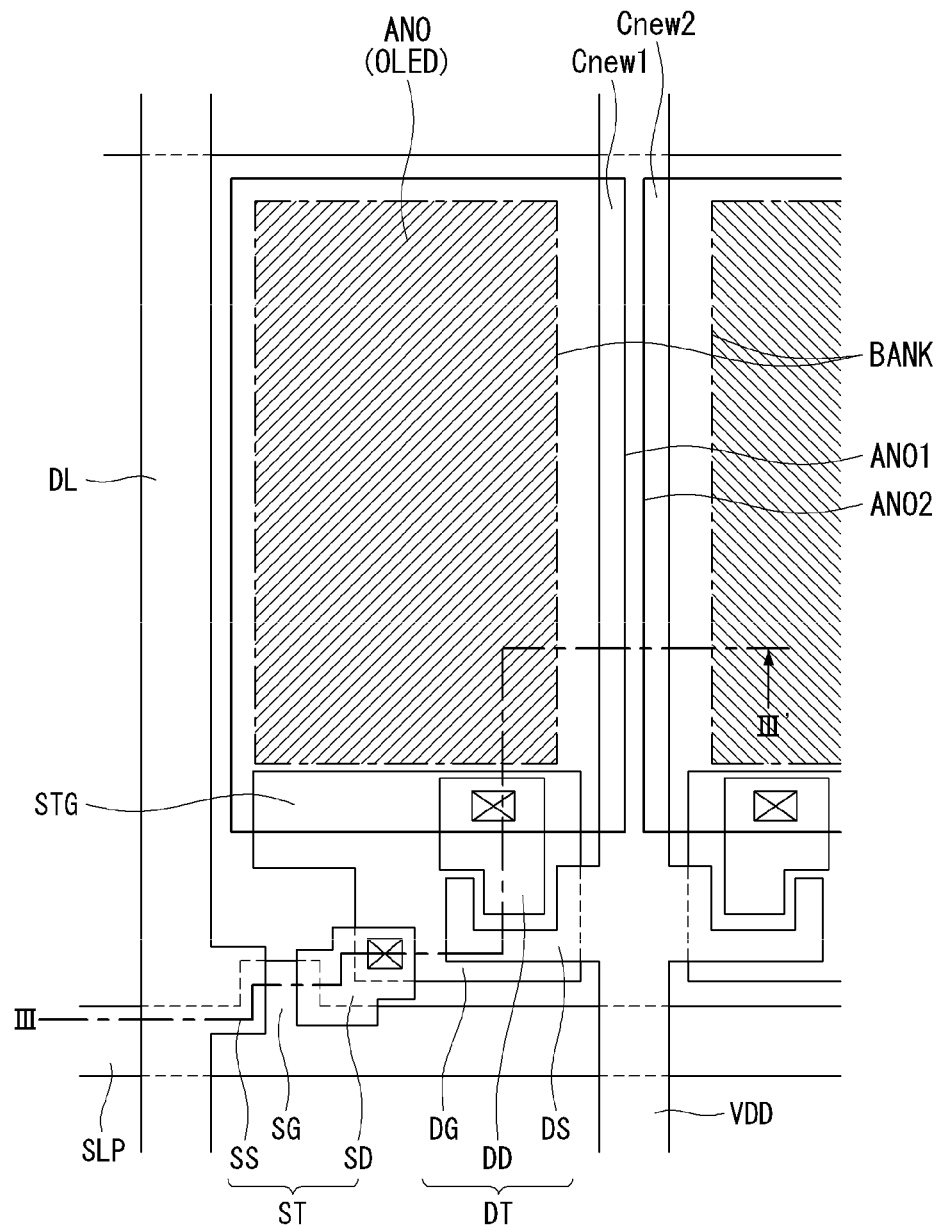
FIG. 10 is a plane view illustrating a bottom emission type organic light emitting diode display according to the second embodiment of the present disclosure.
Figure 11:
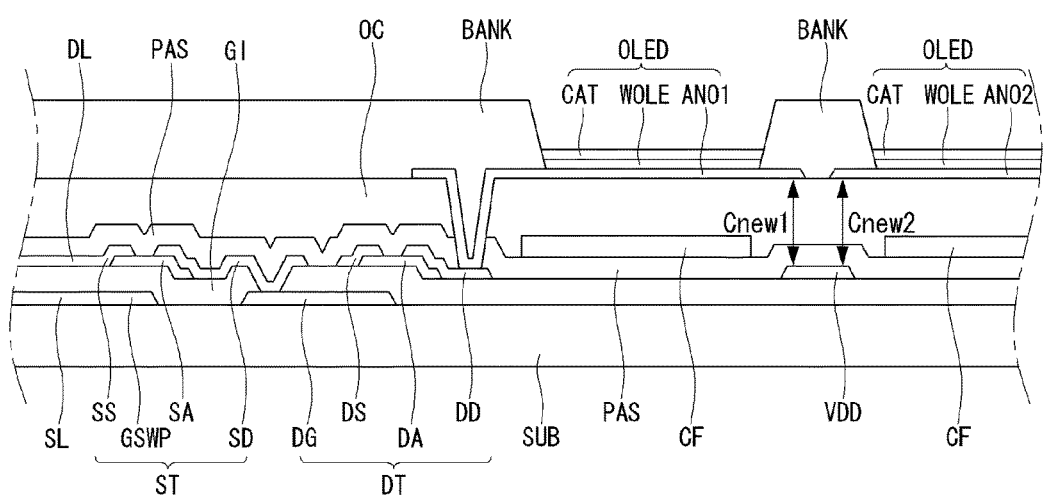
FIG. 11 is a cross sectional views illustrating the structure of the bottom emission type organic light emitting diode display by cutting along the line III-III' in FIG. 10.

Hereinafter, referring to FIGS. 10 and 11, we will explain the second embodiment of the present disclosure. FIG. 10 is a plane view illustrating a bottom emission type organic light emitting diode display according to the second embodiment of the present disclosure. FIG. 11 is a cross sectional views illustrating the structure of the bottom emission type organic light emitting diode display by cutting along the line III-III' in FIG. 10.

The structure of the organic light emitting diode display according to the second embodiment of the present disclosure is mostly similar with that of the first embodiment. The difference is that one driving current line VDD is commonly overlapped with two neighbored anode electrodes ANO disposed at the left side pixel area and the right side pixel area from the driving current line VDD, respectively. That is, when the organic light emitting diode display has the structure for reducing the number of the driving current line VDD, the main feature of the present disclosure can be applied.

Referring to FIGS. 10 and 11, two neighboring pixel columns shares one driving current line VDD disposed between the two pixel columns. That is, these two neighboring pixel columns are symmetrically designed with respect to the driving current line VDD. Therefore, a first anode electrode ANO1 disposed at the left pixel area is expanded for overlapping with some portions of the driving current line VDD, so that a first additional capacitance Cnew1 can be formed. Further, a second anode electrode ANO2 disposed at the right pixel area is expanded for overlapping with other portions of the driving current line VDD, so that a second additional capacitance Cnew2 can be formed.

For the case of the first embodiment, as each pixel column has one driving current line VDD, the anode electrode ANO can be expanded to cover the two edges of the driving current line VDD. If required, the anode electrode ANO can be expanded to cover some portions including only one edge of the driving current line VDD. This overlapped area can be varied according to the required and/or designed amount of the additional capacitance Cnew.

In the interim, for the case of the second embodiment, one driving current line VDD is allocated at the neighbored two pixel columns. Therefore, the first anode electrode ANO1 disposed at one side (left side) pixel area overlaps with one side portion (right side portion) of the driving current line VDD to form the first additional capacitance Cnew1. Like that, the second anode electrode ANO2 disposed at other side (right side) pixel area overlaps with other side portion (left side portion) of the driving current line VDD to form the second additional capacitance Cnew2.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. An organic light emitting diode display comprising:
   a data line and a plurality of scan lines on a substrate;
   a driving current line allocated to a pixel column including a first pixel area and a second pixel area on the substrate;
   wherein the first pixel area and the second pixel area included in the pixel column each include:
   an anode electrode including an expanded portion that covers two edges of the driving current line, the expanded portion of the anode electrode overlaps an entire width of the driving current line;
   a capacitance formed between the expanded portion of the anode electrode that overlaps the entire width of the driving current line;
   an organic emission layer disposed on the anode electrode;

a cathode electrode disposed on the organic emission layer;

a bank defining a light emitting area in the anode electrode as an anode of an organic light emitting diode, the anode of the organic light emitting diode overlapping the cathode and the organic emission layer;

a color filter disposed under the anode electrode; and a driving thin film transistor electrically connected to the anode electrode, the driving thin film transistor at a first side of the color filter;

wherein the driving current line is at a second side of the color filter that is opposite the first side of the color filter, and the driving current line non-overlapping with the driving thin film transistor;

wherein the capacitance is formed outside of the light emitting area and wherein the bank is over substantially an entire area of the capacitance and the bank is not overlapped with the anode of the organic light emitting diode.

2. The device according to the claim 1, wherein at least one of the first pixel area and the second pixel area further comprises:

an over coat layer covering the color filter, and disposed under the anode electrode.

3. The device according to the claim 1, wherein each of the first pixel area and the second pixel area each further comprises:

a switching thin film transistor connected to the data line and the scan line; and wherein the driving thin film transistor is connected to the switching thin film transistor and the driving current line.

4. The device according to the claim 3, wherein one of a drain electrode and a source electrode of the switching thin film transistor is connected to a gate electrode of the driving thin film transistor, and one of a drain electrode and a source electrode of the driving thin film transistor is connected to the anode electrode.

5. The device according to the claim 4, further comprising:

a storage capacitance formed between a gate electrode of the driving thin film transistor and the anode electrode.

6. An organic light emitting diode display comprising:

data lines and scan lines defining pixel areas on a substrate;

a driving current line commonly allocated between a first pixel column and a second pixel column, the first pixel column and the second pixel column neighboring each other among the pixel areas;

a first anode electrode disposed at the first pixel column, and a second anode electrode disposed at the second pixel column, the first anode electrode including an expanded portion that overlaps a first portion of the driving current line, and the second anode electrode including an expanded portion that overlaps a second portion of the driving current line, wherein an amount of overlap between the expanded portion of the first anode electrode and the first portion of the driving current line is substantially the same as an amount of overlap between the expanded portion of the second anode electrode and the second portion of the driving current line;

a first capacitance formed between the expanded portion of the first anode electrode that overlaps the first portion of the driving current line, and a second capacitance formed between the expanded portion of the second anode electrode that overlaps the second portion of the driving current line;

an organic emission layer disposed on the first anode electrode and the second anode electrode;

a cathode electrode disposed on the organic emission layer and an electron transport layer, and a bank defining a first light emitting area in the first anode electrode as an anode of a first organic light emitting diode and the bank defining a second light emitting area in the second anode electrode as an anode of the second organic light emitting diode, wherein the anode of the first organic light emitting diode overlaps a first portion of the cathode and a first portion of the organic emission layer, and wherein the anode of the second organic light emitting diode overlaps a second portion of the cathode and a second portion of the organic emission layer;

a color filter disposed under the first and the second anode electrodes within the pixel areas; and an over coat layer covering the color filter, and disposed under the first and the second anode electrodes;

a driving thin film transistor electrically connected to the first anode electrode, the driving thin film transistor at a first side of the color filter;

wherein the driving current line is at a second side of the color filter that is opposite the first side of the color filter, and the driving current line non-overlapping with the driving thin film transistor;

wherein the first capacitance and the second capacitance are formed outside of the first light emitting area and the second light emitting area, and the first capacitance and the second capacitance are formed at the space filled with the over coat layer inserted between the first and the second anode electrodes and the driving current line.

7. The device according to the claim 6, wherein the first anode electrode and the second electrode are disposed with a predetermined distance on the driving current line.

8. The device according to the claim 6, further comprising:

a switching thin film transistor connected to the data line and the scan line in the each pixel area; and wherein the driving thin film transistor is connected to the switching thin film transistor and the driving current line.

9. The device according to the claim 8, wherein one of a drain electrode and a source electrode of the switching thin film transistor is connected to a gate electrode of the driving thin film transistor, and one of a drain electrode and a source electrode of the driving thin film transistor is connected to at least one of the first and the second anode electrodes.

10. The device according to the claim 9, further comprising;

a storage capacitance formed between a gate electrode of the driving thin film transistor and at least one of the first and the second anode electrodes.

11. An organic light emitting diode display comprising:

a data line and a plurality of scan lines on a substrate;

a driving current line allocated to a pixel column including a first pixel area and a second pixel area on the substrate;

wherein the first pixel area and the second pixel area included in the pixel column each include:

an anode electrode including an expanded portion that overlaps the driving current line for forming an additional anode capacitance between the expanded portion of the anode electrode and the driving current line;

an organic emission layer disposed on the anode electrode;

a cathode electrode disposed on the organic emission layer overlapping the anode electrode for forming an anode capacitance between the anode electrode and the cathode electrode; and a bank defining a light emitting area in the anode electrode;

a color filter disposed under the anode electrode; and a driving thin film transistor electrically connected to the anode electrode, the driving thin film transistor at a first side of the color filter;

wherein the driving current line is at a second side of the color filter that is opposite the first side of the color filter, and the driving current line non-overlapping with the driving thin film transistor;

wherein the additional capacitance is connected to the anode electrode in parallel for compensating the anode capacitance.

12. The device according to the claim 11, wherein at least one of the first pixel area and the second pixel area further comprises:

an over coat layer covering the color filter, and disposed under the anode electrode.

13. The device according to the claim 12, wherein each of the first pixel area and the second pixel area further comprises:

a switching thin film transistor connected to the data line and the scan line in the pixel area; and wherein the driving thin film transistor is connected to the switching thin film transistor and the driving current line.

14. The device according to the claim 13, wherein one of a drain electrode and a source electrode of the switching thin film transistor is connected to a gate electrode of the driving thin film transistor, and one of a drain electrode and a source electrode of the driving thin film transistor is connected to the anode electrode.

15. The device according to the claim 14, further comprising:

a storage capacitance formed between a gate electrode of the driving thin film transistor and the anode electrode.

* * * * *